United States Patent
Buettner et al.

(10) Patent No.: US 9,057,540 B2
(45) Date of Patent: Jun. 16, 2015

(54) FRAME FOR A SOLAR MODULE

(71) Applicant: Robert Bosch GmbH, Stuttgart (DE)

(72) Inventors: Thomas Buettner, Jena (DE); Markus Siptroth, Dienstedt (DE)

(73) Assignee: SolarWorld Industries Thüringen GmbH, Arnstadt, DE (US)

( * ) Notice: Subject to any disclaimer, the term of this patent is extended or adjusted under 35 U.S.C. 154(b) by 0 days.

(21) Appl. No.: 14/191,934

(22) Filed: Feb. 27, 2014

(65) Prior Publication Data

US 2014/0238489 A1      Aug. 28, 2014

(30) Foreign Application Priority Data

Feb. 28, 2013   (DE) .......................... 10 2013 203 412

(51) Int. Cl.
| | | |
|---|---|---|
| E04D 13/18 | (2014.01) |
| E04H 14/00 | (2006.01) |
| F24J 2/46 | (2006.01) |
| F24J 2/52 | (2006.01) |
| H01L 31/042 | (2014.01) |
| H02S 30/10 | (2014.01) |

(52) U.S. Cl.
CPC .............. F24J 2/4614 (2013.01); F24J 2/5243 (2013.01); H01L 31/0424 (2013.01); F24J 2/4645 (2013.01); H02S 30/10 (2014.12); Y02E 10/40 (2013.01)

(58) Field of Classification Search
CPC ....... F24J 2/4645; F24J 2/4614; F24J 2/5211; F24J 2/526; F24J 2/5243; H02S 30/10
USPC .............. 52/656.1, 656.2, 656.5, 173.3, 209; 248/346.01, 346.4
See application file for complete search history.

(56) References Cited

U.S. PATENT DOCUMENTS

| 4,838,951 | A  * | 6/1989 | Riermeier et al. ............. 136/251 |
| 7,770,351 | B2 * | 8/2010 | Root et al. .................... 52/656.1 |
| 7,956,279 | B2 * | 6/2011 | Morita et al. ................. 136/251 |
| 2011/0180680 | A1 | 7/2011 | Brodam |
| 2011/0185661 | A1* | 8/2011 | Nauck et al. ................. 52/309.4 |
| 2012/0131867 | A1* | 5/2012 | Smith .......................... 52/204.1 |
| 2012/0233840 | A1* | 9/2012 | Motoyama ..................... 29/428 |

FOREIGN PATENT DOCUMENTS

| DE | 10 2006 061 284 A1 | 6/2008 |
| DE | 20 2008 017 629 U1 | 5/2010 |
| EP | 2 432 029 | 3/2012 |

OTHER PUBLICATIONS

Machine translation of DE 10 2006 061 284 dated Jun. 2008 provided by epacenet.com.*

* cited by examiner

Primary Examiner — Brian Glessner
Assistant Examiner — Brian D Mattei
(74) Attorney, Agent, or Firm — Maginot, Moore & Beck LLP

(57) ABSTRACT

A frame for a solar module that includes at least one solar cell. The solar-module frame has a frame corner having a corner connector made of a first material, in particular made of aluminum, and having a corner element made of a second material, which is different from the first material, in particular made of plastics material.

15 Claims, 3 Drawing Sheets

FRAME FOR A SOLAR MODULE

This application claims priority under 35 U.S.C. §119 to patent application no. DE 10 2013 203 412.1, filed on Feb. 28, 2013 in Germany, the disclosure of which is incorporated herein by reference in its entirety.

BACKGROUND

The present disclosure relates to a frame for a solar module and to a solar module having a solar-module frame.

EP 2 432 029 A1 describes a solar module having a front side and a rear side and having a solar cell and a frame. The frame is rectangular and has at least one opening on a short side of the frame.

DE 10 2006 061 284 A1 discloses a panel-like photovoltaic solar module having a frame made of shaped profiles and having plug-in corner-connecting parts, wherein the plug-in corner-connecting parts in the corner regions engage over the top side of the panel-like photovoltaic solar module.

SUMMARY

A frame for a solar module according to the disclosure has the advantage that a stable solar-module frame can be produced cost-effectively in a particularly straightforward manner. Stable connection of the solar-module frame is ensured according to the disclosure by the corner connector. Protection of a corner of the solar module is ensured according to the disclosure by the corner element. Producing the corner connector from a first material and a corner element from a second material allows for functionally adapted selection of the material. For example, the corner connector is produced from aluminum and the corner element is produced from plastics material. In particular, it is thus possible to produce a stable frame cost-effectively, since a corner connector produced from aluminum is particularly easy and stable to produce and since a corner element formed from plastics material can be produced in a particularly cost-effective and flexible manner, for example by injection molding.

Advantageous developments and improvements are made possible by the measures cited in the dependent claims.

In an advantageous development, the corner element has an upper part and a lower part, wherein the corner connector is connected to the corner element in particular by means of a snap-fit connection. The development makes it possible to form a particularly stable frame corner, since the corner connector can be inserted in a particularly stable manner between the upper part and the lower part. In particular the use of a snap-fit connection between the corner element and corner connector allows particularly cost-effective and straightforward connection as well as quick assembly of the frame corner.

It is also advantageous for the corner connector to be arranged in a form-fitting manner between the upper part and the lower part of the corner element, wherein an upper-part outer side and a lower-part outer side along with a corner-connector outer side form, in a form-fitting manner, an outer side of the frame corner of the solar module. A particularly stable frame corner which is smooth on the outer side can thus be formed, since the corner connector has been inserted in a particularly stable manner between the upper part and the lower part.

In a further advantageous embodiment, the upper part is connected to the lower part by a crosspiece. A crosspiece, in the present embodiment, is a thin, elongate connection between two elements to form a single component. In particular, the crosspiece has a latching hook for arresting the snap-fit connection to the corner connector. The development makes it possible to produce a frame corner which is particularly straightforward and quick to assemble, since the corner connector can be connected particularly straightforwardly to the corner element by the crosspiece. It is advantageous, in particular, for a latching hook for arresting the snap-fit connection to be fitted on the crosspiece, since the corner element can thus be connected particularly firmly and straightforwardly to the frame corner via the crosspiece.

It is also advantageous for the upper part to have at least one channel, wherein the channel is designed to channel away liquid from a surface of the solar module, in particular from a surface which covers over the solar cell. This particularly advantageously avoids the situation where liquid backs up on the surface of the solar module, since liquid, in particular rainwater, can flow off from the surface of the solar module and, in particular, from that part of the surface of the solar module which covers over the solar cell, via the channel.

In a further embodiment, the channel is formed parallel to the surface of the solar module, in particular along a diagonal of the surface of the solar module. This has the advantageous effect of it being possible for liquid to be channeled away particularly efficiently, since an outflow of liquid can take place to the greatest possible extent independently of the orientation of the solar module.

A corner-element upper side advantageously terminates in a form-fitting manner with a rail upper side of the solar-module frame. Liquid can thus be channeled away particularly efficiently from the surface of the solar module, since there are no further outflows for liquid between the frame rail and the upper side of the upper part and all the liquid is channeled away from the surface of the solar module via the channel.

In a further embodiment, the upper part and/or the lower part have/has at least one fastening element, wherein the fastening element is designed to connect the upper part and/or the lower part to the rail of the solar-module frame. The corner element can thus be assembled in a particularly stable manner, since the corner element, alongside the corner connector, is also retained by the rail of the solar-module frame via the fastening element. This can establish a particularly stable frame corner with an upper part and lower part fastened in a particularly stable manner.

Configuring the corner elements such that the upper part and the lower part are of identical design and are arranged in mirror-inverted fashion in relation to one another has the advantage that the solar-module frame can be assembled particularly straightforwardly. For connecting the corner element to the corner connector and to the frame rail, in order to assemble the solar-module frame, it is possible both for the upper part and for the lower part of the corner element to form an upper side of the solar-module frame.

It is also advantageous for the rail of the solar-module frame to have a cavity with a cavity cross section for accommodating the corner connector, wherein the cavity cross section is selected such that, once the corner connector has been accommodated, a drainage opening remains, in particular on the underside of the cavity cross section. It is thus possible to achieve a particularly high level of durability for a solar-module frame, since condensation can flow out of the cavity via the drainage opening and corrosion of the solar-module frame is thus avoided. The drainage opening particularly advantageously remains on the underside of the cavity cross section, since the outflow of liquid takes place particularly efficiently in this way.

It is also advantageous for the cavity cross section to have a first partial cross section and a second partial cross section, wherein the first partial cross section is of rectangular design for accommodating the corner connector, and wherein the second partial cross section has one side in common with part of the underside of the first partial cross section. A particularly stable solar-module frame can be produced in this way, since the first partial cross section ensures stable accommodation for the corner connector, wherein the second partial cross section serves only for drainage purposes.

A solar module having a solar-module frame according to the disclosure is particularly durable, and provides a long service life, since liquid is channeled away out of the solar-module frame, and corrosion of the solar-module frame is prevented, and also liquid is channeled away from the surface of the solar module, and this prevents the formation of contamination.

Further advantages can be gathered from the following description of embodiments with reference to the figures.

Exemplary embodiments of the disclosure will be explained in more detail in the following Detailed Description, and are illustrated in the drawings

DETAILED DESCRIPTION

A description will be given herein below of a frame for a solar module having at least one solar cell, wherein the solar-module frame has a frame corner having a corner connector made of a first material, in particular made of aluminum, and having a corner element made of a second material, which is different from the first material, in particular made of plastics material. A description will also be given of a solar module having the solar-module frame according to the disclosure.

Figure 1:
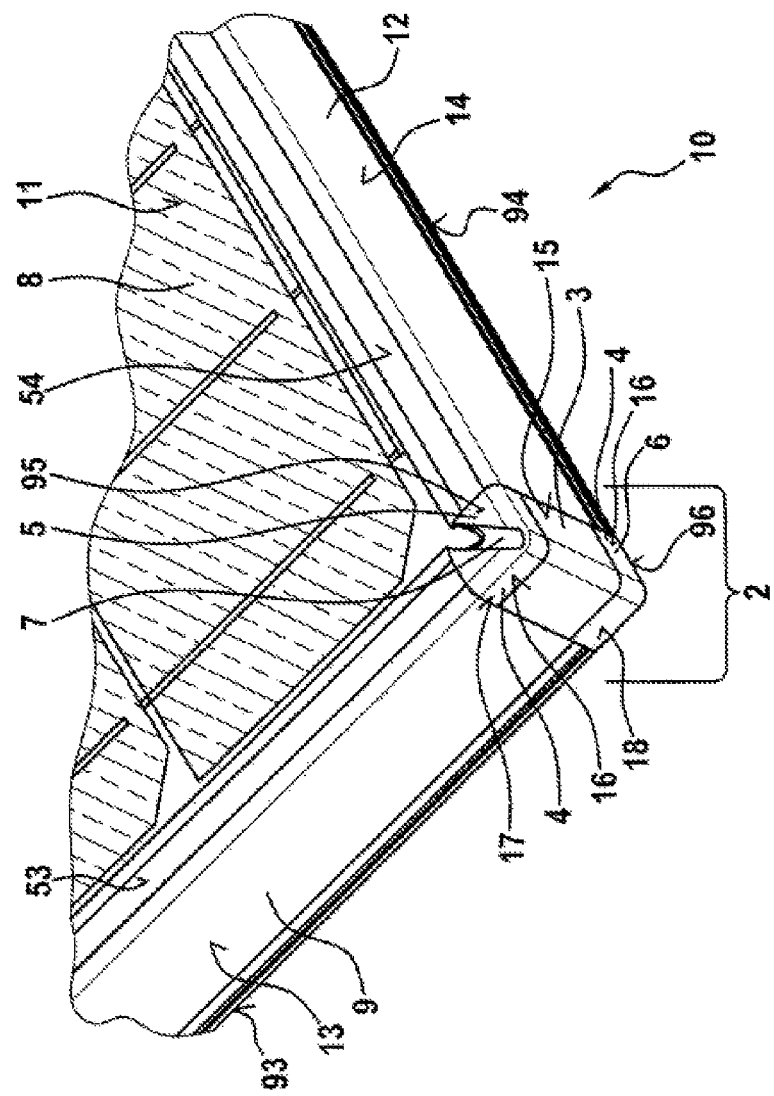
FIG. 1 shows a frame for a solar module.

FIG. 1 shows a frame 10 for a solar module having a solar cell 8. The solar-module frame 10 has a first frame rail 9 and a second frame rail 12. The solar-module frame 10 also has a corner element 4 with an upper part 5 and a lower part 6. The upper part 5 and the lower part 6 have an upper-part outer side 17 and a lower-part outer side 18. Also illustrated are a channel 7, on the upper part 5 of the corner element 4, and a solar cell 8, with a surface 11 which covers over the solar cell. FIG. 1 also shows a corner connector 3. The first frame rail 9 has a first rail outer side 13, a first rail upper side 53 and a first rail underside 93. It is likewise the case that the second frame rail 12 has a second rail outer side 14, a second rail upper side 54 and a second rail underside 94. The corner element 4 has a corner-element upper side 95, a corner-element outer side 16 and a corner-element underside 96, and the corner connector 3 also has a corner-connector outer side 15. The corner connector 3 and the corner element 4, together with the first frame rail 9 and the second frame rail 12, form a frame corner 2.

In the preferred embodiment illustrated, the solar cell 8 is retained by the solar-module frame 10. The solar-module frame 10 comprises the first frame rail 9, the second frame rail 12, the corner connector 3 and the corner element 4. In the embodiment illustrated, the first frame rail 9, the second frame rail 12 and the corner connector 3 are formed from a first material, for example aluminum or steel. The frame rail may also be formed from a further material, which is different from the first material. The corner element 4 is formed from a second material, which is different from the first material, for example from plastics material. The first frame rail 9 is connected to the second frame rail 12 via the corner connector 3. The corner connector 3 is arranged in a form-fitting manner between the upper part 5 and the lower part 6 of the corner element 4. The upper part 5 and the lower part 6 of the corner element 4 along with the corner connector 3 form, in a form-fitting manner, an outer side of the corner 2 of the solar-module frame 10. The corner-connector outer side 15 along with the corner-element outer side 16 here form, in a form-fitting manner, the outer side of the frame corner 2. The corner-connector outer side 15 along with the upper-part outer side 17 and the lower-part outer side 18 forms the outer side of the corner 2 of the solar-module frame. It is also the case that the first rail upper side 53 along with the corner-element upper side 95 and the second rail upper side 54 form, in a form-fitting manner, an upper side of the solar-module frame. The corner element 4 here is connected to the corner connector 3 via a snap-fit connection. During assembly of the solar-module frame, it is, in particular, possible, in a first step, for the corner element 4 to be connected to the corner connector 3 via the snap-fit connection and, in a second step, for the unit formed from the corner element 4 and corner connector 3 to be connected to the first frame rail 9 and the second frame rail 12. The channel 7 is formed in the upper part 5 of the corner element 4. The upper part 5 is arranged, and designed, so as to give a fluid-tight connection between the upper part 5 and a surface of the solar cell 8 and between the upper part 5 and the first frame rail 9 and between the upper part 5 and the second frame rail 12. In particular, the upper part 5 is connected to the first frame rail 9 and/or the second frame rail 12 via a clamping connection. It is in particular likewise the case that there is a clamping connection between the upper part 5 and the solar cell 8. Liquid, in particular water, can thus pass from the surface of the solar module 8, in particular from the surface 11 which covers over the solar cell, through the channel 7 to the outer side of the solar-module frame and thus flow off from the surface 11. The channel has a channel base, wherein the channel base is designed to ensure that liquid is guided along the channel. The channel base and the channel are designed to establish an essentially planar connection for liquid between an outer side of the solar-module frame and the surface 11 which covers over the solar cell. It is particularly advantageous for the channel 7 to run parallel to the surface of the solar module, in particular parallel to the surface 11 which covers over the solar cell. The channel may likewise be designed to be inclined in relation to the surface of the solar module 8, so as to promote an outflow of liquid. The channel 7 has an inlet on a side which is directed toward the solar cell 8. Liquid can enter into the channel 7, through the inlet, from the surface of the solar cell 8. The inlet constitutes a transition between the surface of the solar cell 8 and the channel. The inlet is designed as an incision in the channel base, for example as a circular or as an elliptical incision. The inlet is designed to reduce the droplet formation of liquid at the entrance to the channel and thus to avoid, as far as possible, the situation where particles of dirt are deposited at the channel entrance. At the incision, the channel base is designed to become thinner in a predetermined region. The channel base tapers, in the predetermined region, in the direction of the surface of the solar cell 8 such that there is no edge sufficient for droplet formation between the surface of the solar cell 8 and the channel base. For example, the channel base tapers to a thickness of a plastics-material film, for example to a thickness of less than 100 micrometers. Forming the inlet as an incision in the channel base promotes the outflow of liquid and flushing of the inlet. The flushing is advantageously influenced by a circular or by an elliptical incision, since there is no further edge formed at the incision. An effective edge with which the water has to negotiate as it flows is reduced by the presence of the incision. Liquid can thus pass over into the channel in a particularly straightforward manner from the solar-module surface, and droplet formation is suppressed in addition.

In the embodiment illustrated, the stability of the solar-module frame 10 is established by the corner connector 3, whereas, the corner element 4, rather than performing any frame-carrying function, constitutes predominantly an edge protector and ensures an outflow of liquid from the surface which covers over the solar cell. The corner connector 3 is designed to connect the first and the second frame rails in a stable manner to one another.

Figure 2:
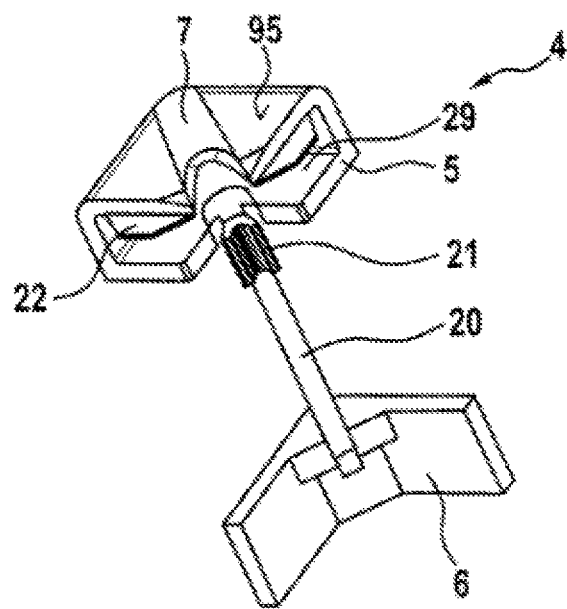
FIG. 2 shows a corner element for a frame corner of a solar-module frame.

FIG. 2 shows the corner element 4 for the corner 2 of the solar-module frame 10.

The corner element 4 has the upper part 5, the lower part 6 and the channel 7. Furthermore, the upper part 5 has a surround 29 for accommodating the solar cell 8. Also illustrated are a crosspiece 20, a latching hook 21 and a fastening element 22. The fastening element 22 is optional and, in a further alternative embodiment (not illustrated), does not form part of the corner element 4. The upper part 5 and the lower part 6 are connected to one another via the crosspiece 20. The optional fastening element 22 is formed on the corner-element upper side 95 and is of trapezoidal design.

The latching hook 21 is arranged on the crosspiece 20 and is designed to undergo a snap-fit connection to the corner element (not illustrated). In particular, the latching hook 21 is formed on the crosspiece 20. The optional fastening element 22 ensures a particularly advantageous, liquid-tight connection of the upper part 5 to the first frame rail and/or to the second frame rail of the solar-module frame. In particular, the solar cell is accommodated with clamping action in the surround 29. The clamping accommodation of the solar cell gives rise to a liquid-tight connection between the corner-element upper side 95 and the surface of the solar cell. In particular, during assembly of the solar-module frame, the fastening element 22 is accommodated with clamping action between the solar cell and the first frame rail or the second frame rail. The clamping accommodation of the fastening element particularly advantageously establishes a liquid-tight connection between the corner-element upper side 95 and the first rail upper side or the second rail upper side. The lower part 6 provides for additional protection for the edge of the solar-module frame.

Figure 3:
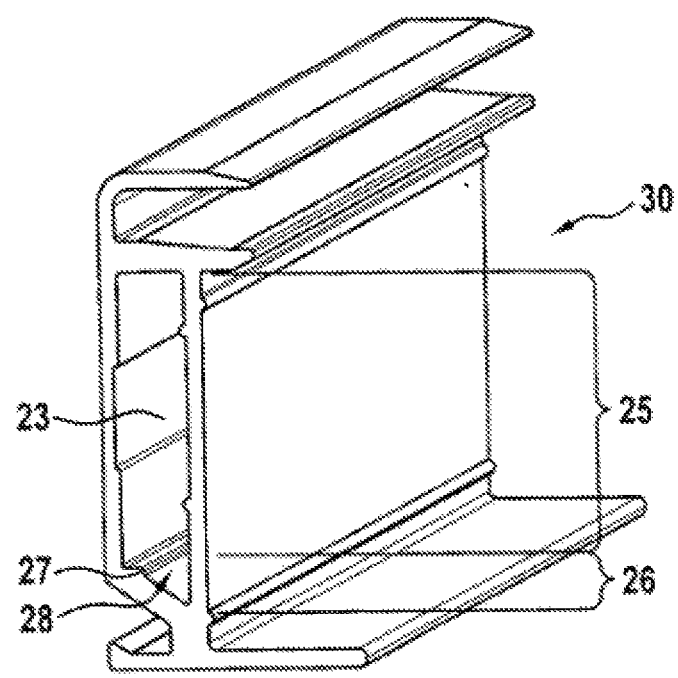
FIG. 3 shows a rail of a solar-module frame with a cavity for accommodating a corner connector.

FIG. 3 shows a frame rail 30 of a solar-module frame with a cavity 23 for accommodating a corner connector.

The frame rail 30 is one which is used as a first frame rail or as a second frame rail of the solar-module frame. The frame rail 30 has a cavity 23 with a first partial cross section 25 and a second partial cross section 26. The frame rail also has a stabilizing corner 27 belonging to an underside 28 of the first partial cross section 25. The stabilizing corner 27 forms since the second partial cross section 26 shares only part of one side with the underside 28 of the first partial cross section 25. In the exemplary embodiment illustrated, the first partial cross section 25 is rectangular and the second partial cross section 26 is triangular. A remaining part of the underside 28 of the first partial cross section 25 forms the stabilizing corner 27 in that the remaining part forms one side of the first partial cross section 25, but does not form any side of the second partial cross section 26.

The first partial cross section 25 is designed to accommodate the corner connector, in particular a corner-connector limb, in the cavity 23, which is located at the rear. Accommodating the corner connector in the cavity 23 ensures stable connection of the frame rail 30 to the corner connector. The corner connector accommodated in the cavity 23 is stabilized in addition by the stabilizing corner 27. Once the corner connector has been accommodated in the first partial cross section 25, the second partial cross section 26 and the cavity located behind the same remain open, wherein the second partial cross section 26 forms a drainage opening for the outflow of liquid, in particular condensation, out of the cavity 23. The second partial cross section 26 may be of any desired shape, wherein the shape of the second partial cross section 26 is selected so as to ensure an outflow of liquid in the direction of the corner element when the solar-module frame is assembled with the frame rail 30 and the corner connector.

Figure 4:
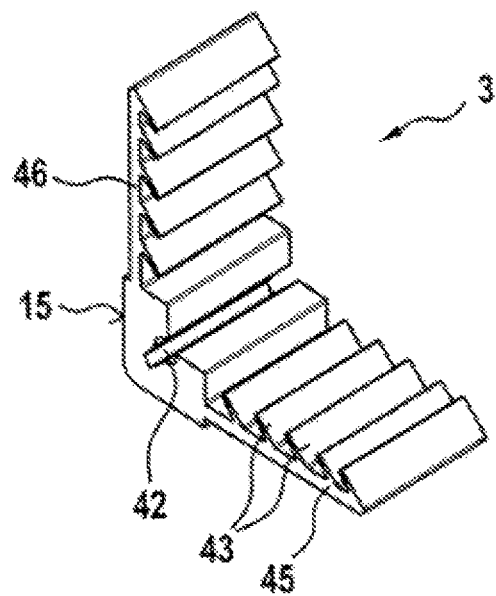
FIG. 4 shows a corner connector with a latching-hook mount.

FIG. 4 shows a corner connector 3 with a latching-hook mount 42.

The corner connector 3 has a first corner-connector limb 45, a second corner-connector limb 46 and a latching-hook mount 42. The first corner-connector limb 45 and the second corner-connector limb 46 each have barbs 43. The corner-connector outer side 15 is also illustrated. The latching-hook mount 42 is arranged at the location where the first corner-connector limb 45 is connected to the second corner-connector limb 46. The latching-hook mount 42 of the corner connector 3 is designed to undergo a snap-fit connection to the corner element, in particular to the latching hook of the corner element. During assembly of the solar-module frame, the corner element is introduced, by way of the crosspiece, into the latching-hook mount 42 such that the latching hook undergoes a snap-fit connection to the latching-hook mount 42. The corner-connector outer side 15 then forms a form-fitting connection to the upper part and to the lower part of the corner element. In particular, the corner-connector outer side 15 forms a form-fitting outer side along with the corner-element outer side. For assembly of the solar-module frame, the first corner-connector limb 45 is introduced into the cavity of the first frame rail and the second corner-connector limb 46 is introduced into the cavity of the second frame rail. The barbs 43 here engage in the cavity of the respective frame rail and form a friction-fit connection.

Figure 5:
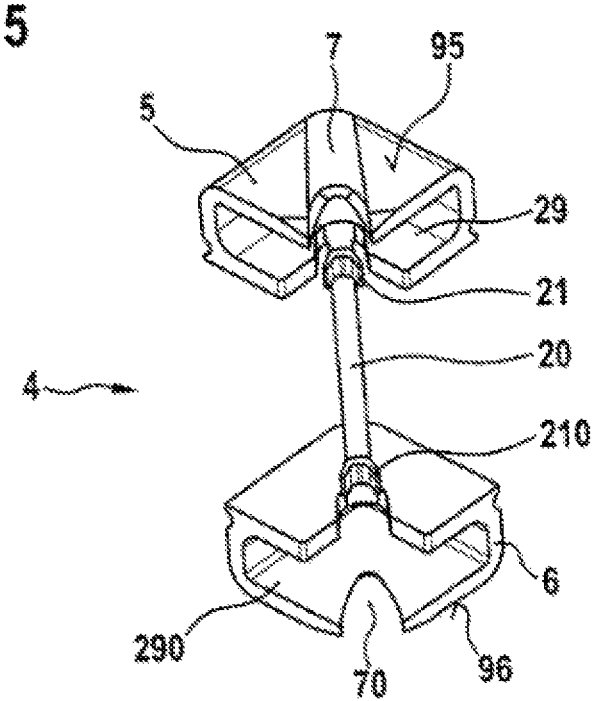
FIG. 5 shows an alternative embodiment of the corner element for the frame corner of the solar-module frame.

FIG. 5 shows an alternative embodiment of the corner element 4 for the corner of the solar-module frame. As in the embodiment illustrated in FIG. 2, the corner element 4 has the upper part 5, the lower part 6 and the channel 7. In addition, the upper part 5 likewise has the surround 29 for accommodating the solar cell. Also illustrated are the crosspiece 20 and the latching hook 21. The latching hook 21 is arranged in the vicinity of the upper part 5. The embodiment illustrated has dispensed with the optional fastening element on the upper part 5. The upper part 5 and the lower part 6 are connected to one another via the crosspiece 20. In the alternative embodiment illustrated, the upper part 5 and the lower part 6 are of identical design and are arranged in mirror-inverted fashion in relation to one another. The lower part 6 has a further channel 70 on the corner-element underside 96 and also has a further surround 290. A further latching hook 210 is arranged on the crosspiece 20, in the vicinity of the lower part 6. The mirror-inverted arrangement of the upper part 5 in relation to the lower part 6 means that the corner element is designed symmetrically in relation to a center point of the crosspiece 20. The corner-element upper side 95 and the corner-element underside 96 here form mutually opposite sides of the corner element. During assembly of the solar-module frame, it is thus possible to use both the upper side 5 and the underside 6 of the corner element 4 for forming the upper side of the solar-module frame, since the upper side 5 and underside 6 are of identical design. Assembly of the solar-module frame is thus simplified to a considerable extent, since there is no need to distinguish between the upper side 95 and the underside 96 of the corner element during assembly. Rather, it is possible for the corner element 4 to be connected to the corner connector and for the corner connector with the corner element then to be connected to the first frame rail and to the second frame rail in any desired orientation.

A solar-module frame with frame corners according to the present disclosure has four frame rails, four corner connectors and four corner elements. Each corner element has a channel. The solar-module frame is in the form of a rectangle. In each case two frame rails are connected to one another in a stable manner via the corner connector. Each of the four corners of the solar-module frame is formed by a corner connector and a corner element with a channel. The corner connectors connect the frame rails to form a stable, rectangular frame.

A solar module having at least one solar cell and having a solar-module frame described above has a solar cell accommodated in a surround of the frame rails and in the surround of the corner elements. The channels of the corner elements allow an outflow of liquid from a surface of the solar cell. Using a corner element with a respective channel for each of the four corners of the solar-module frame makes it possible for liquid to flow off from the surface of the solar cell, via the channel, irrespective of the orientation of the solar module.

What is claimed is:

1. A frame for a solar module comprising:
   a frame corner including a corner connector made of a first material, and
   a corner element having an upper part that includes at least one channel, the corner element made of a second material different from the first material, the channel being defined in an outer surface of the upper part and is configured to channel fluid away from an outer surface of the solar module,
   wherein the channel includes a channel base formed by the corner element, the channel base being arranged substantially planar with an outer surface of a solar module being held in the frame.

2. The frame according to claim 1, wherein at least one of (i) the first material is aluminum, or (ii) the second material is a plastic material.

3. The frame according to claim 1, wherein the corner element further comprises a lower part, and the corner element is connected to the corner connector via a snap-fit connection.

4. The frame according to claim 3, wherein the corner connector is configured to be positioned in a form-fitting manner between the upper part and the lower part, such that an outer side of the upper part and an outer side of the lower part fit in a form-fitting manner with an outer side of the corner connector and form an outer side corner of the frame.

5. The frame according to claim 3, wherein the corner element further comprises a crosspiece, and the upper part is connected to the lower part by the crosspiece.

6. The frame according to claim 5, wherein the crosspiece comprises a latching hook configured to receive the snap-fit connection.

7. The frame according to claim 1, wherein the at least one channel is configured to channel away liquid from a surface of the solar module.

8. The frame according to claim 1, wherein the at least one channel runs parallel to a surface of the solar module and along a diagonal of the surface of the solar module.

9. The frame according to claim 1, wherein the frame further comprises at least one frame rail.

10. The frame according to claim 9, wherein an upper side of the corner element terminates in a form-fitting manner with an upper side of the at least one frame rail.

11. The frame according to claim 9, wherein:
    the upper part includes at least one fastening element; and
    the at least one fastening element is configured to connect the upper part to the at least one frame rail.

12. The frame according to claim 3, wherein the upper part and the lower part are substantially identical and are positioned in mirror-inverted fashion in relation to one another.

13. The frame according to claim 9, wherein the at least one frame rail comprises a cavity having a cavity cross section configured to receive the corner connector, and the cavity cross section is further configured such that receiving the corner connection fails to obstruct a drainage opening on an underside of the cavity cross section.

14. The frame according to claim 13, wherein the cavity cross section comprises: a first partial cross section defines a rectangular periphery configured to receive the corner connector; and a second partial cross section having one side in common with at least a portion of an underside of the first partial cross section.

15. A solar module comprising:
    at least one solar cell; and
    a solar-module frame including a corner connector made of a first material, and a corner element having an upper part that includes at least one channel, the corner element made of a second material different from the first material.
    wherein the channel is defined in an outer surface of the upper part and is configured to channel fluid away from an outer surface of the solar module, and
    wherein the channel includes a channel base formed by the corner element, the channel base being arranged substantially planar with an outer surface of a solar module being held in the frame.

* * * * *